United States Patent [19]

Tateyama et al.

[11] Patent Number: 5,202,716
[45] Date of Patent: Apr. 13, 1993

[54] RESIST PROCESS SYSTEM

[75] Inventors: Kiyohisa Tateyama; Masami Akimoto, both of Kumamoto; Mitsuru Ushijima, Tama, all of Japan

[73] Assignees: Tokyo Electron Limited, Tokyo; Tokyo Electron Kyushu Limited, Kumamoto, both of Japan

[21] Appl. No.: 904,505

[22] Filed: Jun. 25, 1992

Related U.S. Application Data

[63] Continuation-in-part of Ser. No. 627,357, Dec. 14, 1990, which is a continuation of Ser. No. 308,470, Feb. 10, 1989, Pat. No. 4,985,722.

[30] Foreign Application Priority Data

Feb. 12, 1988 [JP] Japan ................. 63-30219
Nov. 5, 1991 [JP] Japan ................. 3-318441

[51] Int. Cl.⁵ ............... G03D 5/04; B65G 1/06; F27B 9/00
[52] U.S. Cl. ............... 354/319; 414/217; 432/121
[58] Field of Search ......... 354/319; 414/217, 225; 432/121

[56] References Cited

U.S. PATENT DOCUMENTS

| | | | |
|---|---|---|---|
| 4,764,076 | 8/1988 | Layman et al. | 414/217 |
| 4,917,556 | 4/1990 | Stark et al. | 414/217 |
| 5,015,177 | 5/1991 | Iwata | 432/121 |

Primary Examiner—Donald A. Griffin
Attorney, Agent, or Firm—Oblon, Spivak, McClelland, Maier & Neustadt

[57] ABSTRACT

A resist process system of the present invention includes at least two robots for conveying a wafer, a passage through which the robots can move, plural process units arranged along the passage, and a waiting unit for temporarily holding the wafer which is to be processed. The waiting unit is arranged beside the passage and between the process units and it includes plural compartments partitioned in it.

11 Claims, 8 Drawing Sheets

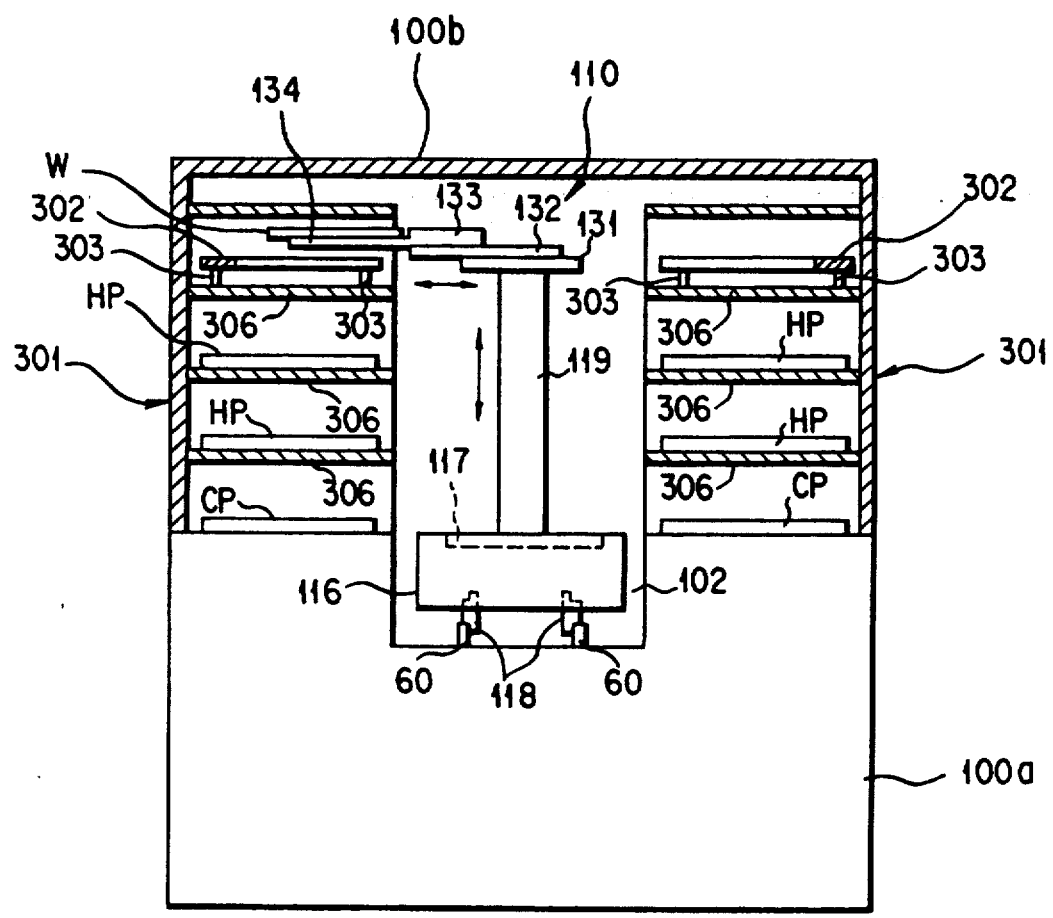
F I G. 4

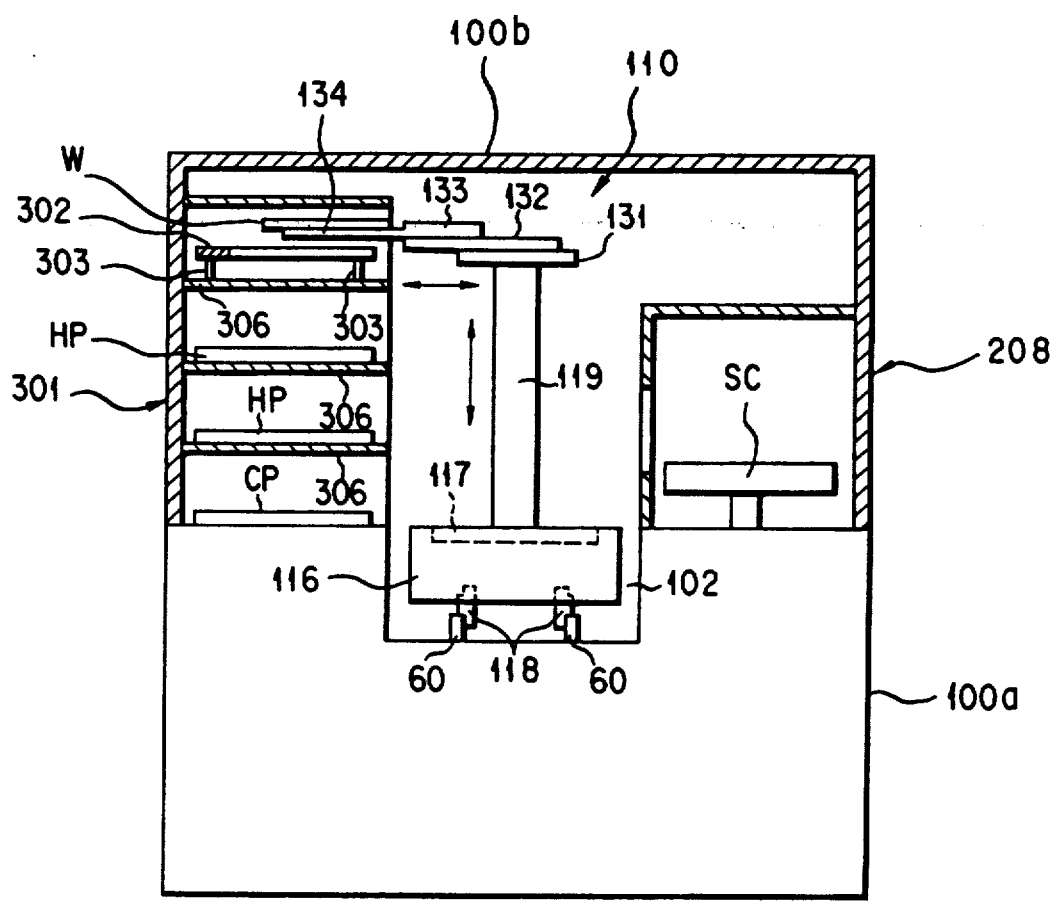
F I G. 6

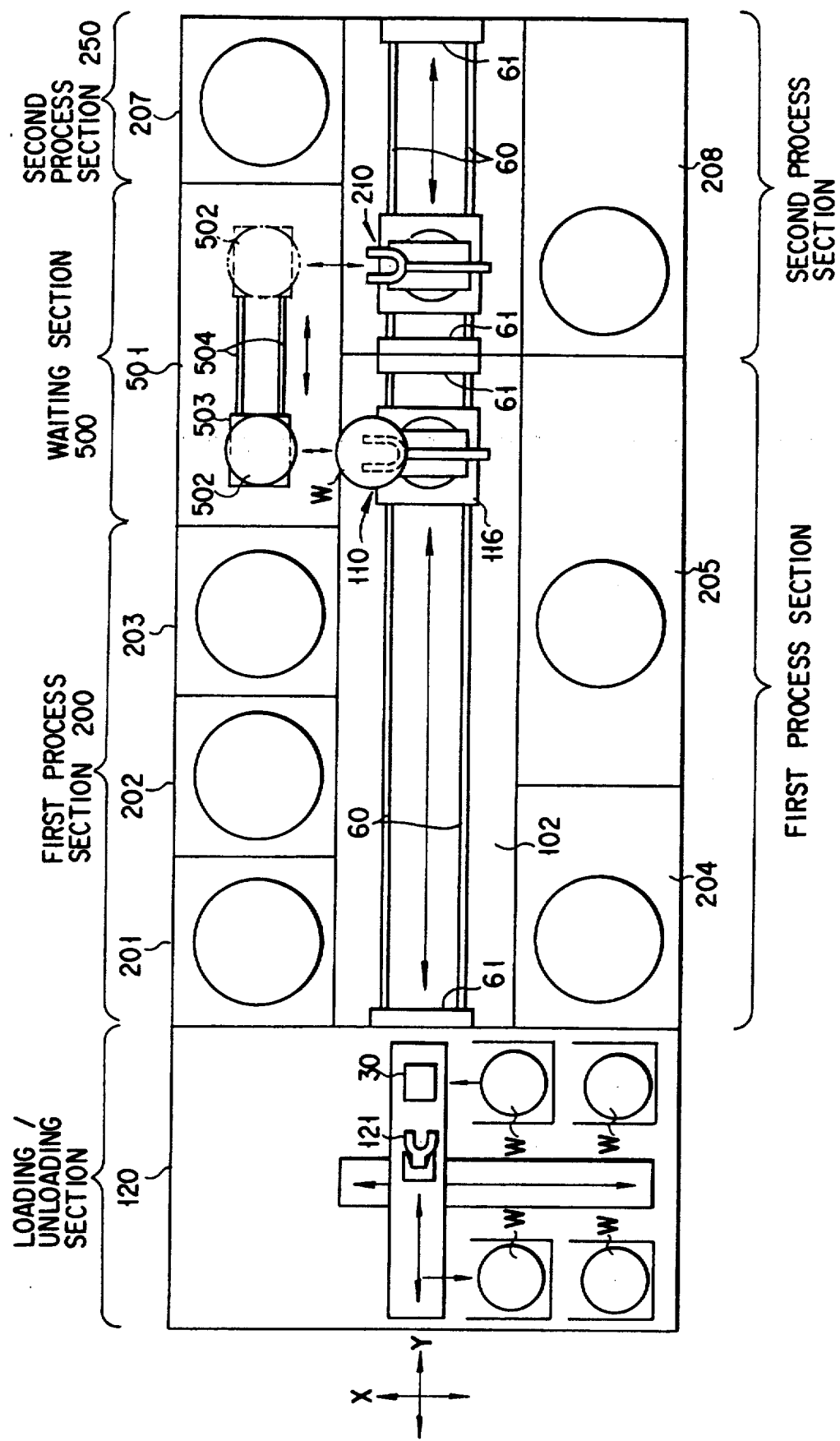
F I G. 8

RESIST PROCESS SYSTEM

CROSS-REFERENCES TO THE RELATED APPLICATIONS

This is a continuation-in-part, of U.S. Ser. No. 627,357, filed on Dec. 14, 1990, now allowed, which in turn is a continuation application of U S. Ser. No. 308,470 filed on Feb. 10, 1989, now U.S. Pat. No. 4,985,722 issued Jan. 15, 1991.

BACKGROUND OF THE INVENTION

1. Field of the Invention

The present invention relates to an apparatus for coating a photo-resist film on the surface of a substrate and/or, for developing the photo-resist film subsequent to being exposed with a predetermined pattern, which is used in the manufacture of a semiconductor device, such as an integrated circuit. In particular, the apparatus of the invention is effectively used in manufacturing various types of ASICs with small production in each type.

2. Description of the Related Art

In the manufacture of a semiconductor device, such as an integrated circuit (IC), numerous steps for microfabrication are performed to form a device, such as a transistor, in a wafer of, for example, a silicon single crystal. Of these steps, a photoengraving process (PEP) is of greater importance because of PEP provides the base of a present microfabrication technique. In the PEP, a predetermined resist pattern is formed on the surface of the wafer, the resist pattern being employed as, for example, an etching mask.

The formation of the resist pattern by the PEP comprises the steps of coating a photo-resist on the wafer surface to provide a photo-resist film of uniform thickness, selectively exposing the photo-resist film at a predetermined area and developing the exposed photoresist film to form a desired pattern. In this exposing step, use is made of an exposing device, such as a step and repeat aligner (that is, a stepper). On the other hand, the step for forming the photo-resist film on the substrate surface is carried out with, for example, an apparatus as will be explained below in more detail.

FIG. 1 is a flowchart showing the processing steps of a photo-resist film formation apparatus called a track system, including treating units carrying out a preheating step 4, cooling step 5, coating step 6 and heating step 8. Semiconductor wafers W are introduced into the aforementioned apparatus such that each is held within a cassette 2. The semiconductor wafers W are taken out of the cassette 2 sheet by sheet and conveyed by a belt conveying mechanism 3 sequentially to the respective units for performing the respective treatment to be carried out there. At the preheating step 4, the wafer W has its moisture removed by heating and, subsequent to being cooled by the cooling step 5, is conveyed to the coating unit where a photo-resist is evenly coated on the surface of the wafer W by means of, for example, a spinner coater. The photo-resist-coated wafer W is sent to the heating unit 8 having a conveyor mechanism 7 called a walking beam system. At the heating unit 8, the photo-resist solution on the wafer is converted into a stable film. At the completion of the heating step 8, the wafer W with a desired photo-resist thin film formed thereon is conveyed into cassette 10 where it is stored as a "treated" wafer.

As set out above, in the conventional apparatus, the respective independent treating units are installed in a serial array and a semiconductor wafer to be treated has to be conveyed inevitably past all these units in a "one-way" course in a predetermined order whether all these treatment is required or not. It is, therefore, not possible to freely change a "once-set" treating order or to cause the wafer to pass selectively through only a predetermined unit or units.

The treating process necessary for forming an IC in the semiconductor wafer W, including its treating sequence, differs depending upon the kinds of IC's to be formed on the wafer. In spite of some step or steps being unnecessary, it is unavoidable in the conventional apparatus that all the aforementioned steps have to be carried out on the semiconductor wafer. This cause a bar to the implementation of improved throughput.

Under this situation, there has been a growing demand for an apparatus which can freely select any particular treating unit or units and can freely change the order for passing through the units in accordance with the kinds of wafers to be treated.

Many process stations (or sections) are needed in the course of manufacturing semiconductor devices. It is therefore necessary to consider that the space in factory can be used as efficiently as possible by designing each of the process stations and each interface station between the process stations as small as possible. In addition, it is important that the carriage of wafers can be attained as efficiently as possible in order to increase the throughput of the factory.

SUMMARY OF THE INVENTION

It is accordingly the object of the present invention to provide a small system which increases the throughput.

According to an aspect of the present invention, a resist process system comprises conveying means for conveying wafer; a passage along which the conveying means is movable; a plurality of process units arranged beside the passage; and at least one waiting unit for temporarily keeping the wafer which is to be processed; wherein said waiting unit is arranged beside the passage and between the process units.

According to this resist process system, since wafer to be processed can be loaded to/unloaded from the waiting unit as occasion requires the operating efficiencies of each process unit and the conveying means are developed and the throuhput is increased. Also, since the waiting unit is provided along the passage and between the process unit as a result the passage is shortened and the entire system is miniaturized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a vertically-sectioned view showing a waiting section in the resist process system;

FIG. 6 is a vertically-sectioned view showing a waiting section in the second resist process system;

FIG. 8 is a plan schematically showing the whole of the resist process system according to a fourth embodiment of the present invention.

DETAILED DESCRIPTION OF THE PREFERRED EMBODIMENTS

Figure 1:
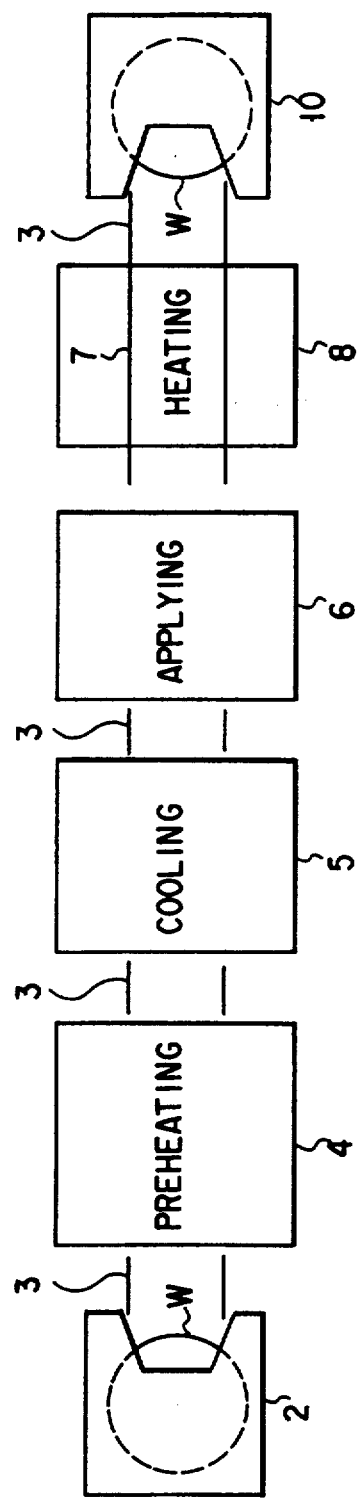
FIG. 1 is a block diagram showing the conventional resist processing system.
Figure 2:
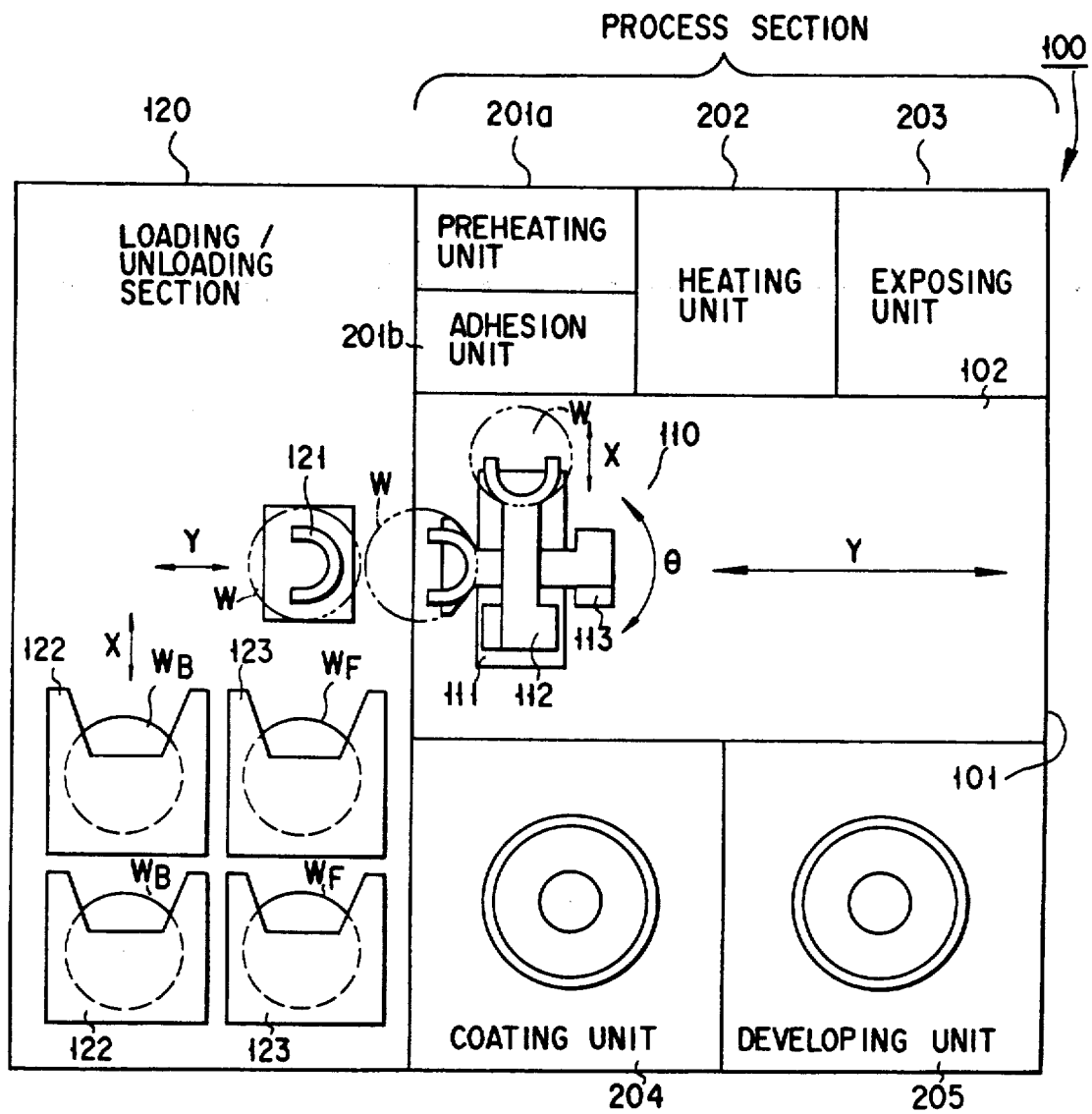
FIG. 2 is a plan showing a part of wafer loading/unloading and process sections.

FIG. 2 shows a plan view showing an apparatus 100 according to an embodiment of the present invention which is adapted to apply a photo-resist film on a semiconductor wafer and/or to develop the photoresist film subsequent to being exposed with a specific pattern. In FIG. 2, reference numeral 101 shows a body base of the apparatus. A passage 102 is provided at the middle of the body base 101 and extends in a lateral direction as indicated by an arrow Y in FIG. 2. On one side of the passage 102 are provided a prehearing unit 201a for eliminating moisture, etc. from untreated semiconductor wafer by heating the wafer with or without HMDS treatment, an adhesion unit 201b for applying HMDS the wafer, a heating unit 202 for heating the wafer subsequent to, for example, being coated with the photoresist solution to dry it, and an exposing unit 203 for exposing the wafer. The heating unit 202 has upper heating plate and lower heating plate arranged in an overlapping fashion. On the other side of the passage 102, a coating unit 204 and a developing unit 205 are provided. The applying unit 204 is provided in order to coat, a photo-resist solution on the surface of the wafer which has been preheated and cooled, or in order to spray a developing solution to an exposed photoresist film on the wafer. Though the preheating unit 201a and the adhesion unit 201b are shown provided in a plan array in FIG. 2 for convenience's sake, as a matter of fact, the preheating unit 201a is provided over the adhesion unit 201b.

A wafer conveying device 110 is mounted on the passage 102 to allow the wafer to be travelled in the Y direction by a drive mechanism, not shown, such as a ball screw. A tweezer (handling arms 131, 132, 133) of the conveying device 110 can be moved to the X direction (the width direction of the passage 102), simultaneously in the Y direction (longitudinal direction of the passage 102) and the Z direction (vertical direction), and further can be rotated independently or simultaneously in the θ direction as shown in FIG. 2. In order to allow the tweezer to be moved as described above, a stepping motor and drive mechanism, not shown, such as a ball screw, are coupled to the carriage 116. The conveying device 110 is employed to convey the wafer W to a respective one of the aforementioned treatment units.

A wafer loading/unloading mechanism 120 is provided to the left side of body base 101 and houses a plurality of wafer cassettes 122, 123 with those untreated semiconductor wafers $W_B$ held in the respective wafer cassettes 122 and those treated wafers $W_F$ held in the respective wafer cassettes 123. A pair of tweezers 121 is provided in the wafer loading/unloading mechanism 120 to hold the wafer W under a suction force imposed to the lower surface of the wafer. Like the tweezers 112 and 113, tweezers 121 can be moved in the X and Y directions and can pick up the untreated wafer $W_B$ from the cassette 122 and store the treated wafer $W_F$ into the wafer cassette 123.

The pair of tweezers 121 of the wafer loading/unloading mechanism 120 delivers the untreated wafer $W_B$ to the tweezer of the conveying device 110 and receives the treated wafer $W_F$ from those tweezer of the conveying device 110. That deliver/receive interface is provided at a boundary between the passage 102 and the wafer loading/unloading mechanism 120.

The delivering/receiving operation of the wafers is achieved relative to the respective treatment units by the tweezer of the conveying device 110. The wafer W undergoes various treatments at the respective units 201a to 205 in accordance with a predetermined order. The operation of conveying wafers is all controlled by a control system, not shown. The various treatments at the process units 201a to 205 can freely be set by modifying the program of a control system. That is, the treatments can be effected at some process units alone in accordance with a modified treatment sequence.

Figure 3:
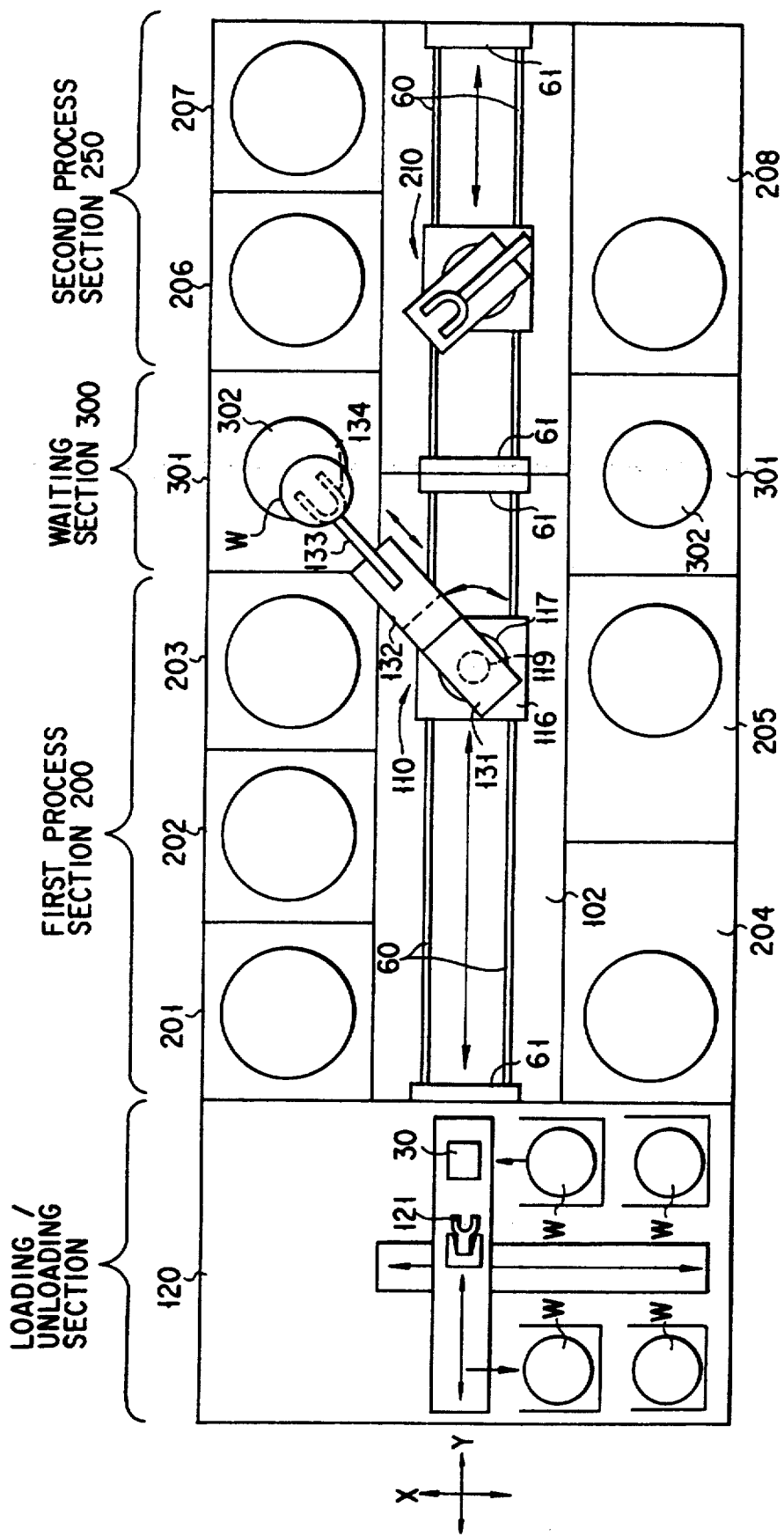
FIG. 3 is a plan schematically showing the whole of the resist process system according to a first embodiment of the present invention.

As shown in FIG. 3, a carriage passage 102 extends along the longitudinal center line of first and second process sections 200 and 250. Process units 206, 207 and 208 of the second process section 250 are arranged along the passage 102 on both sides thereof. A pair of rails 60 extends along the passage 102 at the sections 200 and 250. A first wafer conveying robot 110 runs on the rails 60 in the first section 200 and a second wafer conveying robot 210 runs also on the rails 60 in the second section 250. Stoppers 61 are arranged at both ends of the rails 60 which extend at the first process section 200 and also at both ends of the rails 60 which extend at the second process section 250. Each of these stoppers 61 includes a collision preventing sensor (not shown).

A waiting section 300 including two units 301 is arranged between the first 200 and the second process section 250. The waiting units 301 are opposed to each other with the passage 102 interposed between them. They are positioned in a range where the first and second robots 110 and 210 which run on the rails 60 can gain access to them. They can be detached from their adjacent process units 203, 206 and 205, 208. They serve to transfer wafers between the first 200 and the second process section 250 and they also serve to temporarily keep the wafers.

The rails 60 for the first robot 110 and those for the second robot 210 are separated in front of the waiting unit 301. When arms 131, 132 and 133 of each of the robots 110 and 210 are extended oblique in relation to the rails 60, their front fork 134 can reach a stage 302 of each of the waiting units 301.

As shown in FIG. 4, each waiting section 301 includes four deck compartments vertically divided by partitions 306. The wafer stage 302 is arranged in the most upper deck compartment. The wafer stage 302 is shaped like a ring but cut away at its portion so as to allow the wafer to be mounted on and removed from it.

It is fixed to the partition 306 by support rods 303. A cooling plate CP is arranged in the most lower compartment and heating plates HP are arranged in the second and third compartments, respectively. The wafer stage 302 may be arranged in the most lower or in any of the second and third compartments.

Each of the units 201-208 and 301 is positioned on an air-conditioned body 100a and enclosed by a cover 100b.

Referring to FIG. 4, it will be described how wafers are transferred or carried by the first robot 110, for example.

A body 116 of the robot 110 has two pairs of wheels 118 which run on the rails 60. A turntable 117 is arranged, rotatable on a horizontal plane, on the top portion of the body 116. A lifting shaft 119 is erected, extending upward, on the turntable 117. A base plate 131 is attached to the top of the lifting shaft 119 and the extensible arms 132 and 133 are arranged on the base plate 131. The extensible arms 132 and 133 are placed one upon the other and they can be slid relative to each other on the base plate 131. The wafer holder or fork 134 is attached to the front end of the upper arm 133. Photosensors (not shown) are attached to the wafer holder 134. This wafer holder 134 is described in detail in U.S. Pat. No. 4,958,722.

Shaft rods of the wheels 118, turntable 117, lifting shaft 119 and extensible arms 132, 133 are connected to drive shafts of stepping motors (not shown), which are controlled by controllers backed up by a computer system.

It will be described how silicon wafers each having a diameter of 8 inches are successively processed by the above-described resist process system.

A silicon wafer W, 8 inches in diameter, is carried from the loading/unloading section 120 to the first process section 200 by the first robot 110. The wafer W is adhesion-processed at the adhesion unit 201, resist-coated at the coating unit 204 and baked at the heating unit 202. After this baking process, it is carried into the cooling compartment of the waiting unit 301 and cooled there.

While the wafer W is being processed in this manner, another wafer W is exposed in the exposing unit 203 and a further wafer W is developed in the developing unit 205. These units at the first process section 200 are occupied by the wafers as described above, the first robot 110 runs directly to the waiting section 300 to place wafers W on the stages 302 in the unit 301. The second robot 210 takes out the wafers W from the waiting units 301 and carried them into the second process section 250 where a series of adhesion, resist-coating, exposing and developing processes are applied to them.

According to the above-described first resist process system, wafers W can be more efficiently resist-processed using two waiting units 301 and two conveying robots 110, 210.

Further, each of the waiting units 301 is designed to save space in such a way that it can include plural compartments therein. This enables the whole of the process system to be made more compact in size. Therefore, atmosphere in the process system can be more easily made clean.

Furthermore, the waiting units 301 are positioned not on that line which is on the rails 60 but on the same lines as the process units are positioned. The whole length of the process system can be therefore mode shorter and the system itself can be smaller-sized, accordingly. This is quite effective particularly to the resist process system in which wafers, 8 inches in diameter, are processed.

Although two process sections 200 and 250 have been connected to each other in the case of the above-described embodiment, the present invention is not limited to it, but third and fourth process sections may be added with the waiting section 300 interposed between them.

The resist process system according to a second embodiment of the present invention will be described with reference to FIGS. 5 and 6. Description will be omitted on same components as those in the first resist process system.

Figure 5:
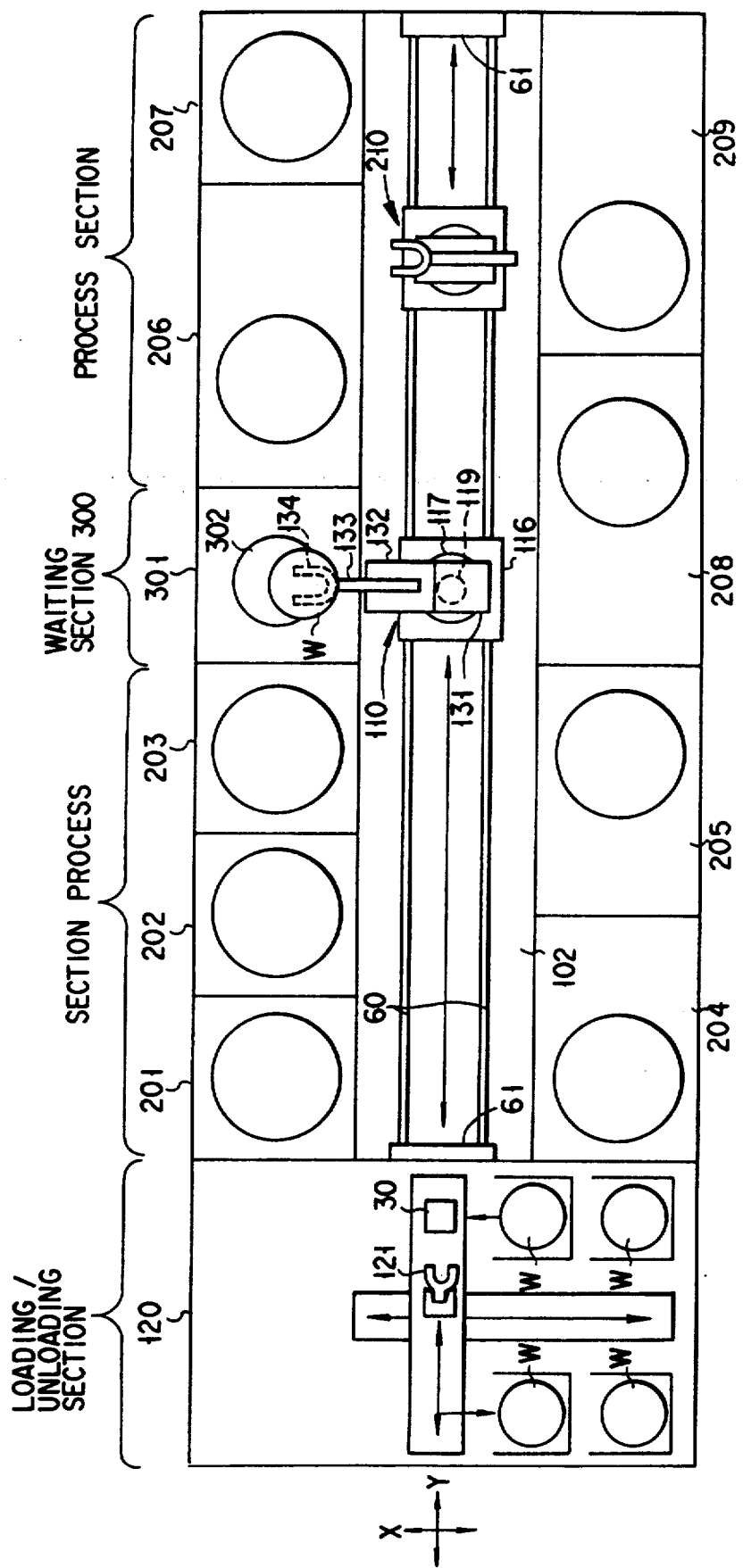
FIG. 5 is a plan schematically showing the whole of the resist process system according to a second embodiment of the present invention.

As shown in FIG. 5, the waiting section 300 is arranged not on both sides of the rails 60 but on one side thereof, that is, between the exposing 203 and the developing unit 206. The rails 60 extend from one end to the other end of the process sections line and the first and second robots 110 and 210 run on the rails 60 in front of the waiting unit 301.

As shown in FIG. 6, the waiting unit 301 is opposed to the coating unit 208 in which a spin coater is housed. The waiting unit 301 is fundamentally same as that in the first embodiment.

According to the above-described second resist process system, the first and second robots 110 and 210 can be positioned just in front of the waiting unit 301. Therefore, the stroke of each of the arms 132 and 133 of each robot can be made shorter.

The resist process system according to a third embodiment of the present invention will be described with reference to FIG. 7. Same components as those in the first embodiment wall not be further described below.

Figure 7:
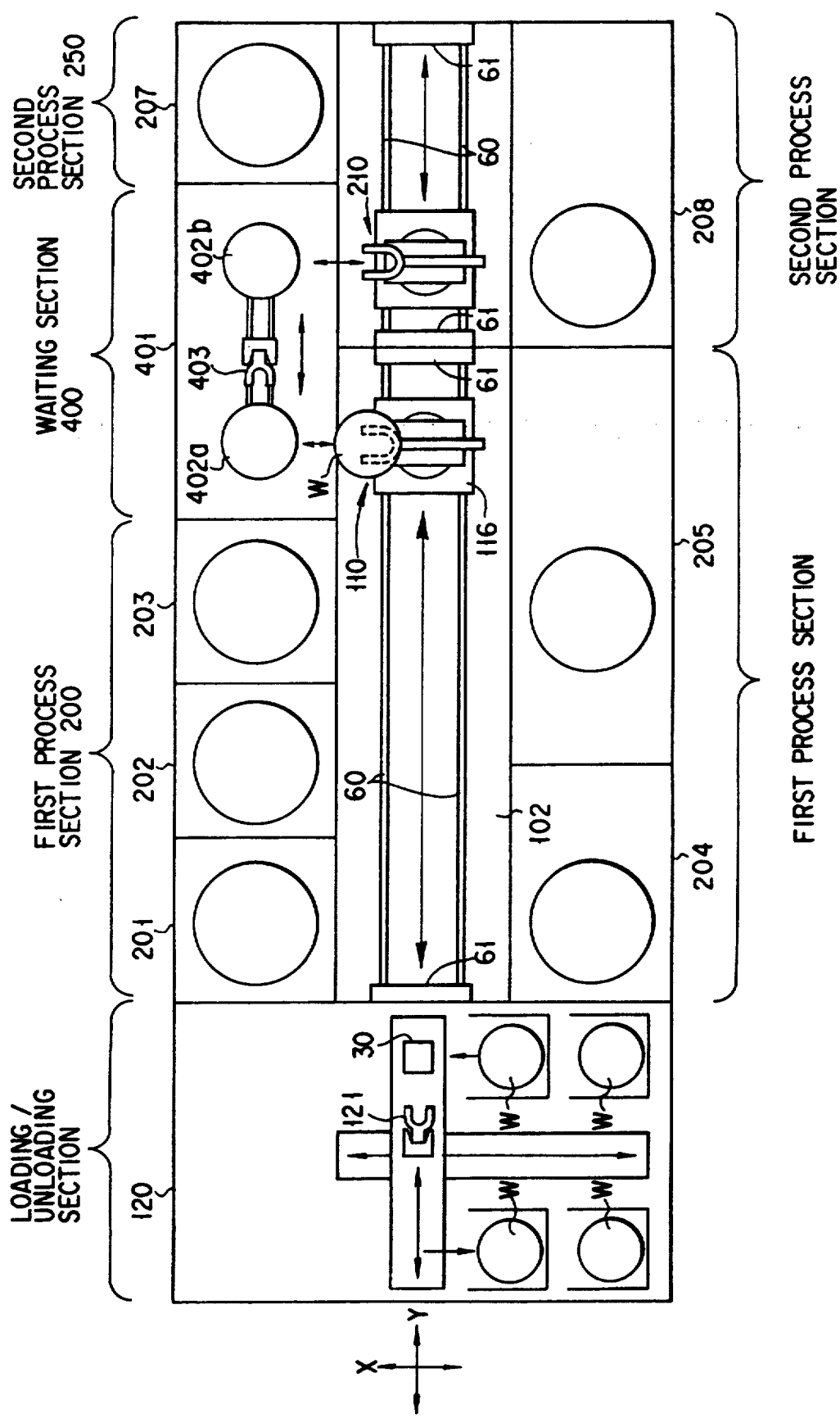
FIG. 7 is a plan schematically showing the whole of the resist process system according to a third embodiment of the present invention.

As shown in FIG. 7, a waiting section 400 is arranged between the first 200 and the second process section 250. A waiting unit 401 is beside the rails 60 and positioned in front of the first and second robots 110 and 210 when these robots finish their running on the rails 60 toward it.

Two wafer stages 402a and 402b are provided in the waiting unit 401. One wafer stage 402a is provided in front of the running area of the first robot 110 and the other wafer stage 402b is provided in front of the running area of the second robot 210. A handling device 403 is arranged between the wafer stages 402a and 402b. This handling device 403 is substantially same as the one 121 at the loading/unloading section 120.

Each of the wafer stages 402a and 402b is substantially same as the one 302 in the first embodiment. However, the wafer stages 402a and 402b are not fixed to the frame but supported rotatable on a plane by the frame.

It will be described how the wafers W are loaded to/unloaded from the waiting unit 401.

A wafer W is taken out from the process unit 205 and carried to the waiting section 400 by the first robot 110. The first robot 110 is positioned in front of the first wafer stage 402a of the waiting unit 401 to mount the wafer W on the stage 402a. The first stage 402a is turned by a quarter to direct its cut-away portion toward the handling device 403. The wafer W is transferred from the first stage 402a to the second stage 402b by the handling device 403. The second robot 210 is then positioned in front of the waiting section 400 to carry the wafer W into the second process section 250.

According to the above-described third resist process system, the first and second robots 110 and 210 can be positioned in front of the waiting unit 401. Therefore, the stroke of each of the arms 132 and 133 of each robot can be made shorter.

Further, the waiting unit 401 is positioned not on the extended line of the rails 60 but on the line of the process units. The whole length of the system can be thus made shorter and the system itself can be smaller-sized. This is quite effective particularly to the resist process system in which wafers, 8 inches in diameter, are processed.

The resist process system according to a fourth embodiment of the present invention will be described referring to FIG. 8. A further description on same components as those in the first through third embodiments will be omitted.

As shown in FIG. 8, a waiting section 500 is arranged between the first 200 and the second process section 250. A waiting unit 501 is beside the rails 60 and it is positioned in front of the first and second robots 110 and 210 when they finish their running on the rails 60 toward it.

Only one wafer stage 502 is provided in the waiting unit 501 and it is mounted on a travel device 503. Guide rails 504 are arranged at the waiting unit 501, extending parallel to the rails 60 in the passage 102. The single wafer stage 502 on the travel device 503 can be thus moved on the rails 504.

The single wafer stage 502 is substantially same as the one 302 in the first embodiment. The travel device 503 is also substantially same as the body 116.

It will be described how wafers W are carried into and out of the waiting unit 501.

A wafer W is taken out from the process unit 205 and carried into the waiting section 500 by the first robot 110. The first robot 110 is positioned in front of the wafer stage 502 in the waiting unit 501 to transfer the wafer a onto the stage 502. The wafer W is moved from the section 200 to the section 250. The second robot 210 is then positioned in front of the waiting section 500 to carry the wafer W from the waiting section 500 into the second process section 250.

According to the above-described fourth resist process system, the rails 504 at the waiting unit 501 can be made shorter than those in the third embodiment. The length of the waiting unit 501 can be thus made shorter and the whole of the system can be made more small.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A resist process system comprising;
   conveying means for conveying a wafer;
   a passage along which the conveying means is movable;
   a plurality of process units arranged beside the passage; and
   at least one waiting unit for temporarily keeping the wafer which is to be processed;
   wherein said waiting unit is arranged beside the passage and between the process units.

2. The resist process system according to claim 1, wherein said waiting unit includes plural compartments partitioned in it.

3. The resist process system according to claim 2, wherein the wafer stage is housed in the most upper compartment in the waiting unit.

4. The resist process system according to claim 1, wherein at least two conveying means are provided in the passage.

5. The resist process system according to claim 4, wherein said passage is separated in front of the waiting unit and each of the separated passages includes at least one conveying means.

6. The resist process system according to claim 5, wherein an arm of each conveying means is extended oblique to the passage to transfer the wafer into and out of the waiting unit.

7. The resist process system according to claim 5, further comprising a waiting unit provided with a single wafer stage and travel means for moving the single wafer stage itself in the waiting unit between a position where the wafer is received and a position where the wafer is sent.

8. The resist process system according to claim 4, wherein an arm of each conveying means is extended perpendicular to the passage to transfer the wafer into and out of the waiting unit.

9. The resist process system according to claim 8, wherein said passage is continuous even in front of the waiting unit.

10. The resist process system according to claim 4, wherein said waiting unit has two wafer stages and handling means for transferring the wafer between the two wafer stages.

11. The resist process system according to claim 1, wherein said waiting units are arranged on both sides of the passage.

* * * * *